United States Patent
Yano (10) Patent No.: US 12,354,667 B2
(45) Date of Patent: Jul. 8, 2025

(54) SEMICONDUCTOR DEVICE AND PROGRAMMING METHOD CAPABLE OF PROGRAMMING WITH REDUCED POWER CONSUMPTION

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 372 days.

(21) Appl. No.: 18/080,752

(22) Filed: Dec. 14, 2022

(65) Prior Publication Data

US 2023/0253051 A1    Aug. 10, 2023

(30) Foreign Application Priority Data

Feb. 8, 2022   (JP) .................................. 2022-017687

(51) Int. Cl.
| | | |
|---|---|---|
| *G11C 16/10* | (2006.01) | |
| *G11C 16/08* | (2006.01) | |
| *G11C 16/26* | (2006.01) | |
| *G11C 16/34* | (2006.01) | |

(52) U.S. Cl.
CPC ............ *G11C 16/102* (2013.01); *G11C 16/08* (2013.01); *G11C 16/26* (2013.01); *G11C 16/3459* (2013.01)

(58) Field of Classification Search
CPC ....... G11C 16/102; G11C 16/08; G11C 16/26; G11C 16/3459; G11C 16/32; G11C 16/10; G11C 16/0483; G11C 16/30
See application file for complete search history.

(56) References Cited

U.S. PATENT DOCUMENTS

| | | | | |
|---|---|---|---|---|
| 7,269,766 | B2 | 9/2007 | Slobodnik et al. | |
| 8,995,196 | B2 * | 3/2015 | Huang ............... | G11C 16/3418 |
| | | | | 365/200 |
| 9,349,466 | B2 * | 5/2016 | Kim .................... | G11C 16/0483 |
| 2007/0064480 | A1 * | 3/2007 | Kuo .................... | G11C 16/0491 |
| | | | | 365/185.03 |
| 2007/0115730 | A1 * | 5/2007 | Randolph .......... | G11C 16/0475 |
| | | | | 365/185.29 |
| 2008/0175059 | A1 * | 7/2008 | Kim .................... | G11C 11/5642 |
| | | | | 365/185.11 |
| 2009/0049364 | A1 * | 2/2009 | Jo ....................... | G11C 16/0483 |
| | | | | 714/763 |

(Continued)

FOREIGN PATENT DOCUMENTS

| | | |
|---|---|---|
| CN | 109448774 | 3/2019 |
| JP | 5583185 | 9/2014 |

*Primary Examiner* — Khamdan N. Alrobaie
(74) *Attorney, Agent, or Firm* — JCIPRNET (57) ABSTRACT

The disclosure provides a semiconductor device and a programming method capable of programming with reduced power consumption. The programming method of the NAND flash memory of the disclosure prepares high-speed programming blocks and copy back block for final data storage, responding to an external input programming command while in an power-saving mode, program 1/2 pages of data in even-numbered pages and odd-numbered pages of the high-speed programming blocks respectively, then the data is read out from the high-speed programming blocks, and the read data is normally programmed into the copy back block.

13 Claims, 9 Drawing Sheets

(56) References Cited

U.S. PATENT DOCUMENTS

| | | | |
|---|---|---|---|
| 2010/0246260 A1* | 9/2010 | Kang | G11C 11/5621 |
| | | | 365/185.18 |
| 2013/0182509 A1* | 7/2013 | Lee | G11C 16/3459 |
| | | | 365/185.25 |
| 2015/0310933 A1 | 10/2015 | Purushotham et al. | |
| 2021/0011842 A1* | 1/2021 | Lee | G06F 12/0246 |

* cited by examiner

SEMICONDUCTOR DEVICE AND PROGRAMMING METHOD CAPABLE OF PROGRAMMING WITH REDUCED POWER CONSUMPTION

CROSS-REFERENCE TO RELATED APPLICATION

This application claims the priority benefit of Japan application serial no. 2022-017687, filed on Feb. 8, 2022. The entirety of the above-mentioned patent application is hereby incorporated by reference herein and made a part of this specification.

BACKGROUND

Technical Field

This disclosure relates to a semiconductor device such as a NAND flash memory, in particular to a programming method capable of operating with low power.

Description of Related Art

In NAND flash memory programming, the incremental step pulse programming (ISPP) method is used to control the threshold distribution of the memory cells. The ISPP applies a programming pulse Vpgm0 to the selected page, and applies a programming pulse Vpgm1, which is higher by one step voltage than the programming pulse Vpgm0, to the memory cell that was found to be unqualified in the programming verification, thus enabling narrowing of the threshold distribution width (for example, Prior Art 1: Japanese Patent No. 5583185).

Internet of Things (IoT) devices that use solar power or batteries require to operate in a power-saving mode to reduce power consumption during periods of insufficient power supply, such as at night when solar power generation stops, or when the battery balance becomes low.

In the case where NAND flash memory is equipped with such IoT devices, NAND flash memory is also required to run at low power. However, when programming in the flash memory, a programming voltage of, for example, about 20V is applied to the selected page and a pass-through voltage of, for example, about 10V is applied to the non-selected page, and a relatively large amount of power is required for programming. In addition, if the programming verification fails, the programming is repeated until it passes, thus further consuming power.

SUMMARY

To solve the existing problems, the disclosure provides a semiconductor device and a programming method capable of programming with reduced power consumption.

The programming method of a NAND flash memory of the disclosure includes the followings. At least one block is allocated to a high-speed programming block, and at least one block is allocated to a storage block for final data storage. In response to an external input programming command, 1/2 pages of data is programmed at high-speed respectively on two selected pages of the high-speed programming block. Data of the two selected pages of the high-speed programming block is read out, and the read data is programmed normally into the storage block.

The semiconductor device of the disclosure includes a NAND memory cell array and a programming component programming on a selected page of the memory cell array. The programming component includes a normal programming mode and a high-speed programming mode. The high-speed programming mode includes the followings. At least one block is allocated to a high-speed programming block, and at least one block is allocated to a storage block for final data storage. In response to an external input programming command, 1/2 pages of data is programmed at high-speed respectively on two selected pages of the high-speed programming block. Data of the two selected pages of the high-speed programming block is read out, and the read data is programmed normally into the storage block.

According to the disclosure, 1/2 pages of data is programmed at high-speed respectively in the high-speed programming block, so that the power consumption caused by the high-speed programming may be reduced compared to the normal programming.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The semiconductor device of the disclosure is, for example, a NAND flash memory, or a microprocessor, microcontroller, logic circuit, application specific integrated circuit (ASIC), processor for processing images or sounds, processor for processing signals such as wireless signals, etc., embedded in such a flash memory. In the following description, a NAND flash memory is shown.

Figure 1:
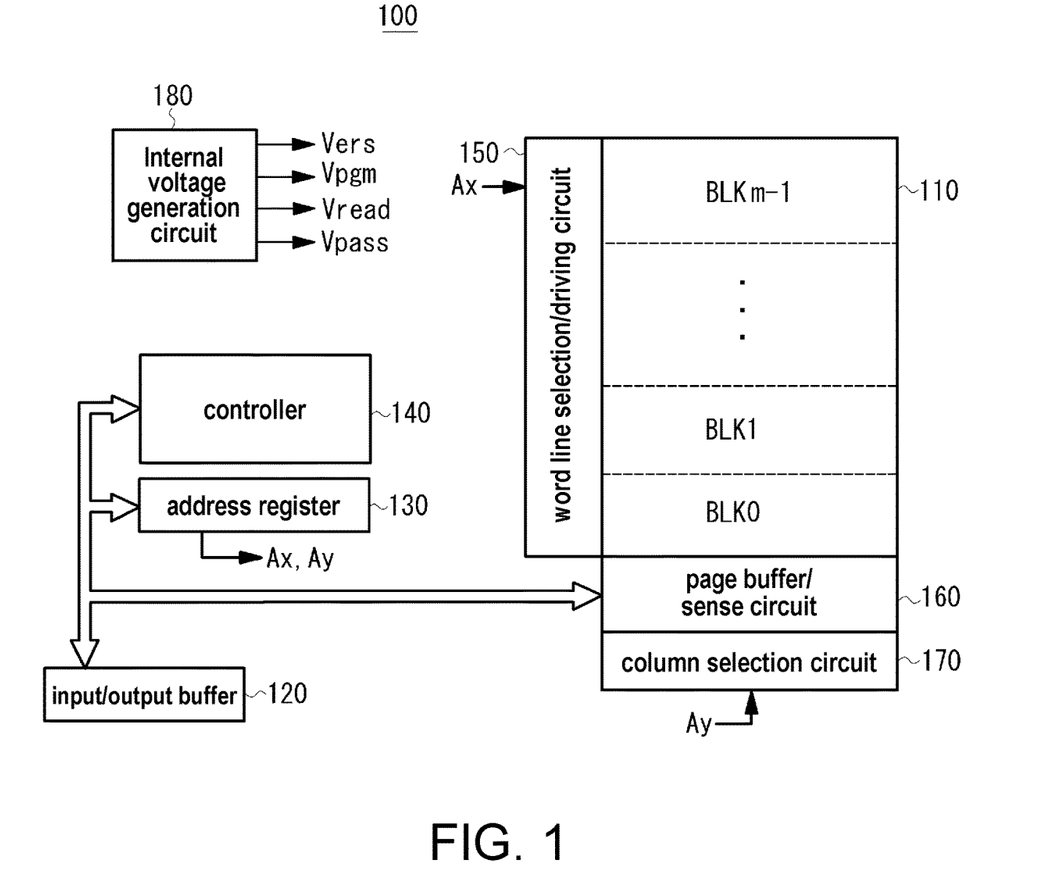
FIG. 1 is a block diagram of a structure of a NAND flash memory according to an embodiment of the disclosure.

As shown in FIG. 1, a flash memory 100 according to this embodiment includes the following components: a storage cell array 110 formed with multiple storage cells; an input/output buffer 120 connected with an external input/output terminal I/O; an address register 130 receiving address data from the input/output buffer 120; a controller 140 controlling each part based on instruction data from the input/output buffer 120 or external control signals; a word line selection/driving circuit 150 performing block selection or word line selection based on row address information Ax from the address register 130; a page buffer/sense circuit 160 holding data read out from a selected page of the memory cell array 110, or holding data that should be programmed to the selected page; a column selection circuit 170 selecting columns (bit lines) in the page buffer/sense circuit 160 based on column address information Ay from the address register 130; and an internal voltage generation circuit 180 generating various voltages (programming voltage Vpgm, readout voltage Vread, erasing voltage Vers, programming or readout pass-through voltage Vpass, etc.) required for read out, programming, erasing, etc.

Figure 2:
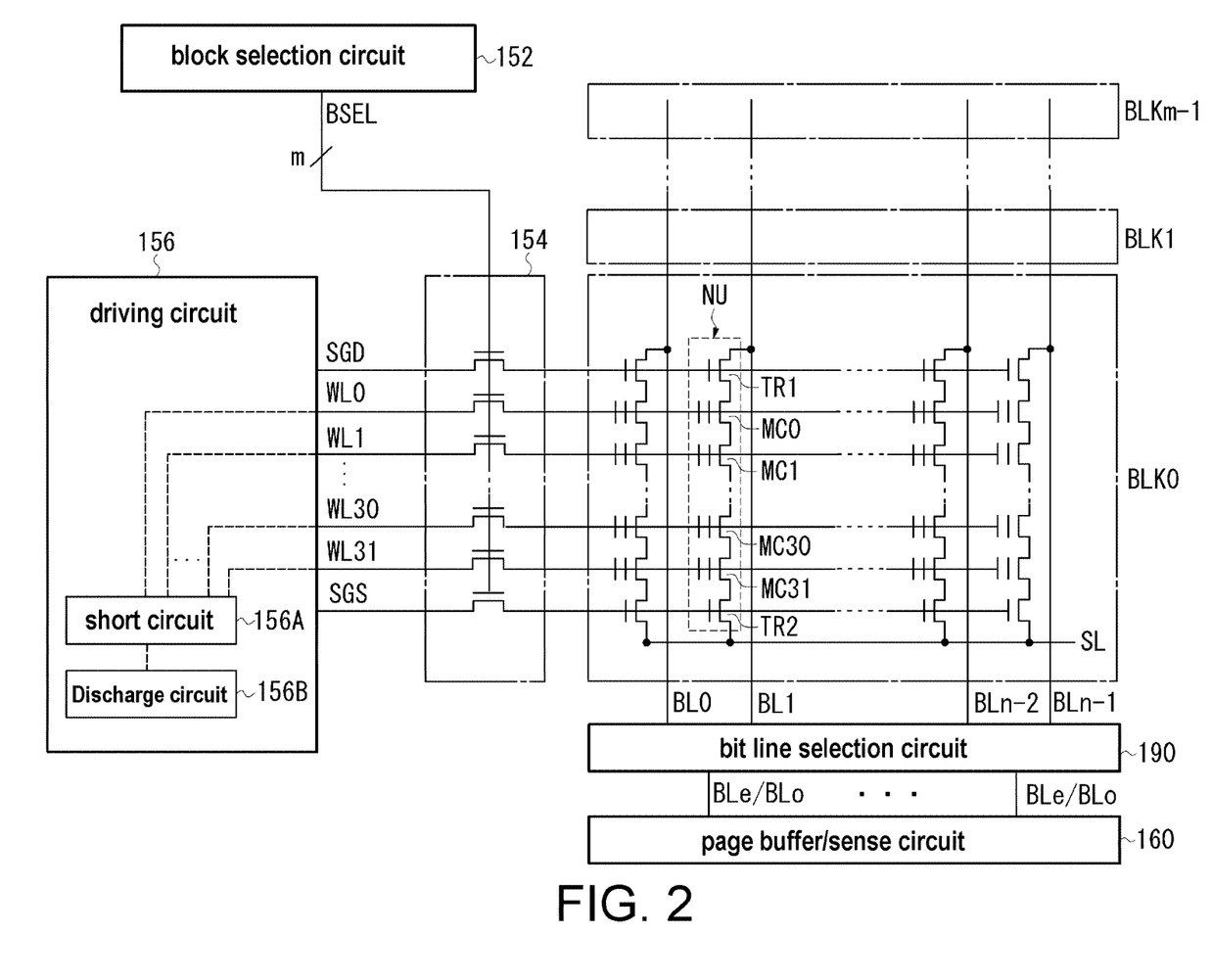
FIG. 2 is a diagram of a structure of a memory cell array and a word line selection/driving circuit according to an embodiment of the disclosure.

As shown in FIG. 2, the memory cell array 110 includes m blocks BLK0, BLK1 . . . BLKm-1. Multiple NAND strings NU are formed in one block, and one NAND string NU includes multiple memory cells (MC0 to MC31) connected in series, a bit line side selection transistor TR1, and a source line side selection transistor TR2. The NAND string NU may be a two-dimensional structure formed on a surface of the substrate, or may be a three-dimensional structure formed in a vertical direction from a surface of the substrate. In addition, the memory cell may store binary data as well as multi-value data.

The bit line side selection transistor TR1 is connected to a corresponding bit line, and the source line side selection transistor TR2 is connected to each of the NAND strings NU through a common source line SL. Gates of the memory cells in a row direction are connected to corresponding word line WL0 to word line WL31 in a common manner, a gate of the bit line side selection transistor TR1 is connected to a selection gate line SGD, and a gate of the source line side selection transistor TR2 is connected to a selection gate line SGS. The word line WL0 to the word line WL31 of each block, the selection gate line SGD, and the selection gate line SGS are connected to a driving circuit 156 through a block selection transistor 154. Bit line BL0 to bit line BLn-1 extending in a column direction are connected to each block in a common manner, and one terminal thereof is connected to the page buffer/sense circuit 160 through a bit line selection circuit 190. The bit line selection circuit 190 selects an even bit line BLe or an odd bit line BLo, and connects the selected bit line BLe/bit line BLo to the page buffer/sense circuit 160.

The word line selection/driving circuit 150 includes a block selection circuit 152, a block selection transistor 154, and a driving circuit 156. The block selection circuit 152 supplies a block selection signal BSEL, which is used to select blocks based on the column address information Ax for selecting a block based on the row address information Ax, to each of the block selection transistor 154. For example, in the case of selecting a block BLK0, the block selection transistor 154 is turned on by the activated block selection signal BSEL, and in the case of selecting the other blocks, the block selection transistor 154 is turned off by the non-activated block selection signal BSEL. A voltage level of the activated block selection signal BSEL is controlled by a voltage generated by an internal voltage generating circuit 180.

The driving circuit 156 drives the selection gate line SGD/selection gate line SGS and word line WL0 to word line WL31 based on the voltage supplied from the internal voltage generation circuit 180. The selection gate line SGD/selection gate line SGS and word line WL0 to word line WL31 are connected to the bit line side selection transistor TR1, the source line side selection transistor TR2, and memory cell MC0 to memory cell MC31 through the activated block selection transistor 154.

In the read out operation, a certain voltage (e.g. 0V) is applied to a selected word line, a readout pass-through voltage (e.g. 4.5V) is applied to a non-selected word line, a voltage (e.g. 4.5V) is applied to the selection gate line SGD/selection gate line SGS at a H level, and 0V is applied to the source line SL. In the programming operation, a high programming voltage Vpgm (e.g. 15 V to 20 V) is applied to the selected word line, a programming pass-through voltage (e.g. 10V) is applied to the non-selected word line, a voltage is applied to the selection gate line SGD at the H level, and a voltage is applied to the selection gate line SGS at a L level. In the erasing operation, 0V is applied to the selected word line in the selected block, and a voltage is applied to the selection gate line SGD/selection gate line SGS at the L level.

The driving circuit 156 further includes a short circuit 156A and a discharge circuit 156B connected to the word line WL0 to the word line WL31. The short circuit 156A and the discharge circuit 156B run during programming verification during high-speed programming in a low-power/high-speed programming mode. After programming and before stating programming verification, the short circuit 156A separates the selected word line and the non-selected word line from the internal voltage generating circuit 180, so that the selected word line holding the programming voltage and the selected word line holding the programming pass-through voltage are electrically shorted to each other, so that the selected word line and the non-selected word line share the same voltage.

The discharge circuit 156B enables charge of the selected word line and the non-selected word line to be discharged to a discharge node by electrically connecting one or more non-selected word line shorted by the short circuit 156A to the discharge node of a certain potential (e.g. an external power supply voltage ExVDD of 3.3V). As a result, a certain voltage is held on the selected word line and the non-selected word line. The certain voltage is adjusted by a discharge time or a number of discharged word line based on the discharge circuit 156B. Subsequently, the selected word line and the non-selected word line are connected to the internal voltage generating circuit 180, the selected word line is driven by a verification readout voltage, and the non-selected word line is driven by the readout pass-through voltage. The short circuit 156A and the discharge circuit 156B may reuse the power supplied to the selected word line and the non-selected word line during programming at the time of verification readout, thus realizing power saving during programming operation. Details of the operation of the short circuit 156A and the discharge circuit 156B will be described later.

The controller 140 includes a microcontroller or a state machine including read only memory (ROM)/random access memory (RAM), and controls readout operation, programming operation, erasing operation, etc. According to an embodiment, the programming operation has a normal programming mode and a low-power/high-speed programming mode. The controller 140 executes the normal programming mode during periods when relatively high power consumption is allowed, and executes the low-power/high-speed programming mode during periods when power consumption is reduced.

Next, the programming operation of the NAND flash memory 100 according to the embodiment is explained. The controller 140 selects a low-power/high-speed programming mode or a standard programming mode based on a command or a control signal input from the outside, and executes programming of the selected mode. For example, an IoT device equipped with NAND flash memory monitors the remaining amount of battery installed, or monitors the operational status of the IoT device, or monitors the power generation status of solar power, and based on these monitoring results, supplies commands or control signals to the controller 140.

According to another embodiment, the controller 140 may autonomously determine the power condition and select the low-power/high-speed programming mode or the normal programming mode. For example, the controller 140 includes a timer that measures time, and selects the low-power/high-speed programming mode or the normal programming mode based on measurement results.

Figure 3:
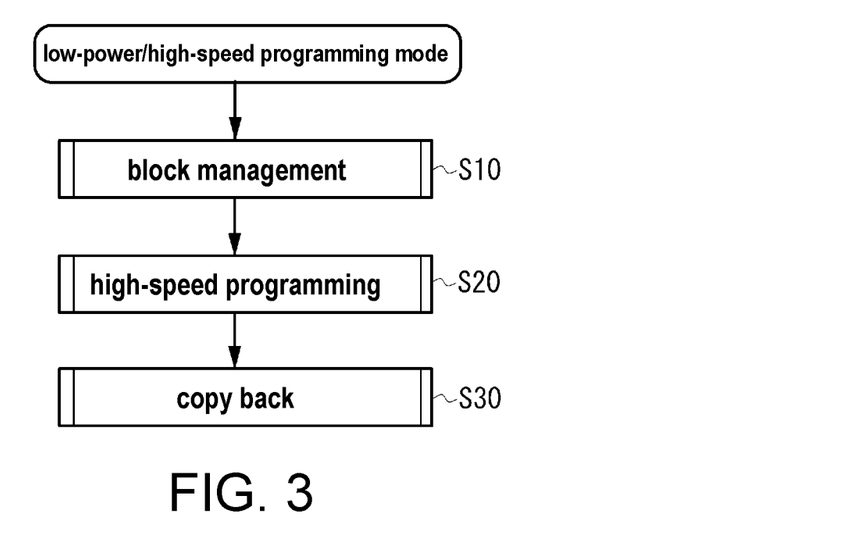
FIG. 3 is a diagram of function of a low-power/high-speed programming mode according to an embodiment of the disclosure.

Next, the low-power/high-speed programming mode according to embodiment is explained. Referring to FIG. 3, the low-power/high-speed programming mode includes functions of block management S10, high-speed programming S20, and copy back S30.

Figure 4:
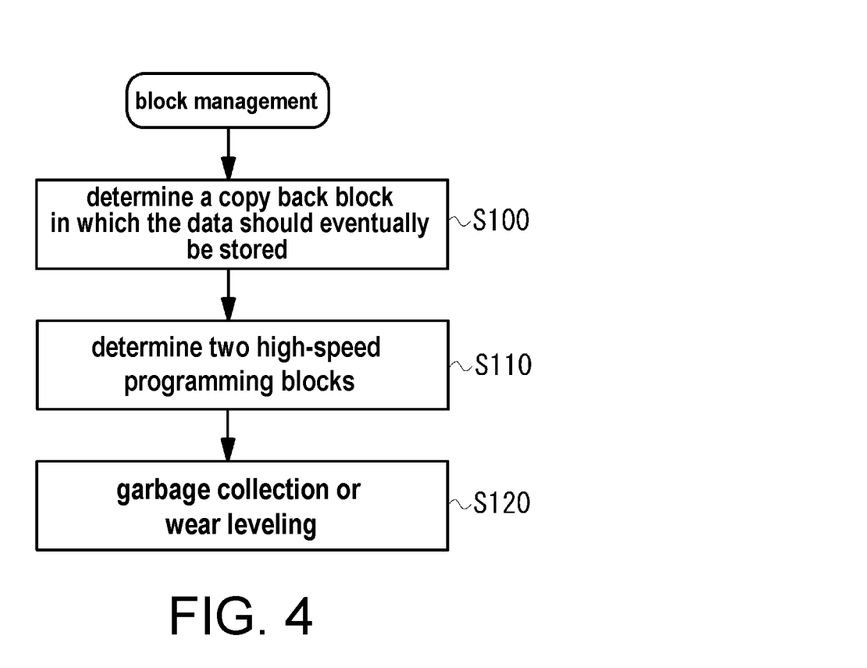
FIG. 4 is a diagram illustrating an operation of block management in a low-power/high-speed programming mode.

FIG. 4 is an operation flow of block management (S10). The controller 140 implements block management when a programming command is input externally, or at any time. First, the controller 140 determines a copy back block in which the data should eventually be stored according to the programming command (S100). A copy back block is a block used for the final storage of data temporarily written by the high-speed programming, which is an erased block.

The controller 140 also determines two high-speed programming blocks (S110). A high-speed programming block is a block used for temporary storage of data by high-speed programming, which is an erased block. When programming data on the selected page of the high-speed programming block, the controller 140 further maintains the relationship between an input address and an address of the high-speed programming block.

Furthermore, the block management performs garbage collection for determining used blocks in the copy back block or the high-speed programming block, or wear leveling for averaging out the number of rewrites of a block (S120).

Figure 5:
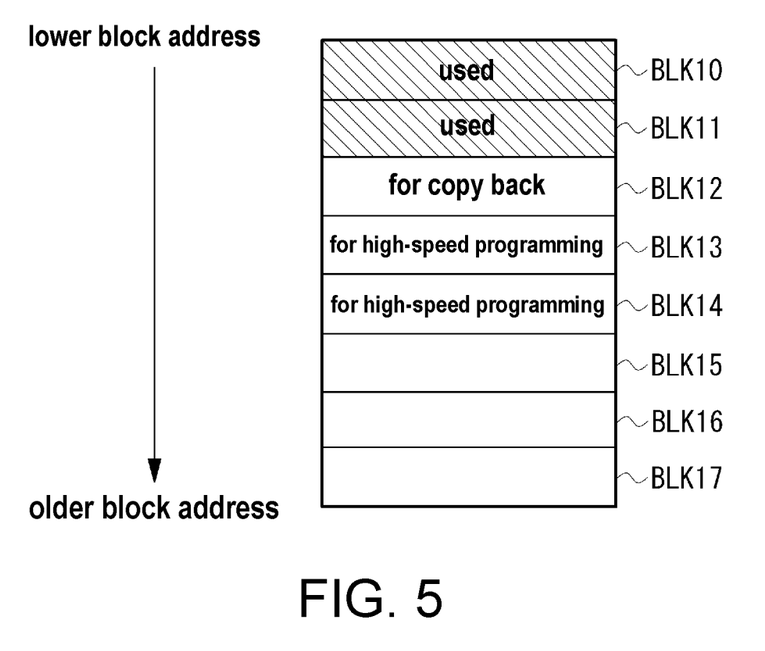
FIG. 5 is a diagram of an example of allocation of a copy back block and a high-speed programming block.

FIG. 5 shows an example of allocation of a copy back block and a high-speed programming block. Here, blocks BLK10 and BLK11 are assumed to be used, and blocks BLK12 to BLK17 are not used (erased) and are used sequentially from a block with a new address. In this case, the controller 140 allocates the block BLK12 as the copy back block, and allocates the two blocks BLK13 and BLK14 as the high-speed programming block. The copy back block and the high-speed programming block may not be allocated contiguous blocks as shown in FIG. 5, e.g., they may be allocated discontinuous blocks according to wear leveling.

Figure 6:
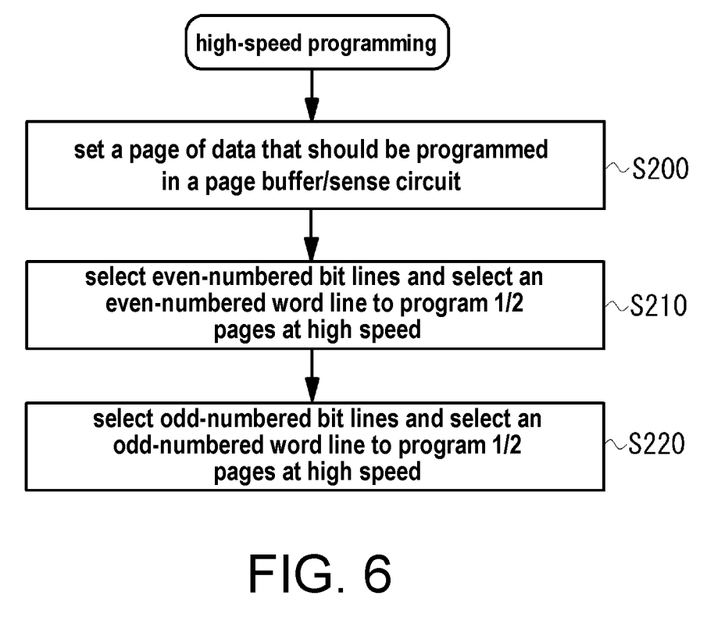
FIG. 6 is a diagram illustrating an operation of high-speed programming in a low-power/high-speed programming mode.

Next, the high-speed programming (S20) is explained. Referring to FIG. 6, when the programming command, address, or data is input from the outside, the controller 140 responds by setting a page of data that should be programmed in the page buffer/sense circuit 160 (S200).

Next, the controller 140 selects even-numbered bit lines of the page buffer/sense circuit 160 through the bit line selection circuit 190, selects even-numbered word lines (hereinafter referred to as even-numbered pages) of the high-speed programming block through the word line selection/driving circuit 150, and programs data of the even-numbered bits of 1/2 pages at high speed is on the selected even-numbered pages (S210). Next, the controller 140 selects odd-numbered bit lines of the page buffer/sense circuit 160 through the bit line selection circuit 190, selects odd-numbered word lines (hereinafter referred to as odd-numbered pages) of the high-speed programming block through the word line selection/driving circuit 150, and programs data of the odd-numbered bits of 1/2 pages at high speed is on the selected odd-numbered pages (S220). Here, an example of programming initially on an even-numbered page, followed by programming on an odd-numbered page, or programming initially on an odd-numbered page, followed by programming on an even-numbered page, is shown.

Here, the so-called high-speed programming refers to programming that takes less time and requires less power to program than the normal programming. According to an embodiment, the high-speed programming is set so that a wave height value (programming voltage) of a programming pulse is lower than that of the normal programming, and a programming pulse width (programming time) is longer than that of the normal programming, and by these settings, the number of times an ISPP-based programming pulse is applied is guaranteed to be less than that of the normal programming. For example, an ISPP-based programming voltage is 0.5 V lower than the normal programming, and the programming pulse width is set to twice the normal programming. The programming pulse width and the programming voltage are adjusted so that, for example, the programming verification of all memory cells passes when two ISPP-based programming pulses are applied.

In addition, in the high-speed programming, read out margin of high-speed programmed memory cell is fully ensured by programming 1/2 pages of data in the even-numbered bit lines and 1/2 pages of data in the odd-numbered bit lines, and by reducing coupling between bit lines. As a result, the high-speed programmed memory cell may guarantee data retention for a certain period of time (e.g., 24 hours).

Figure 7:
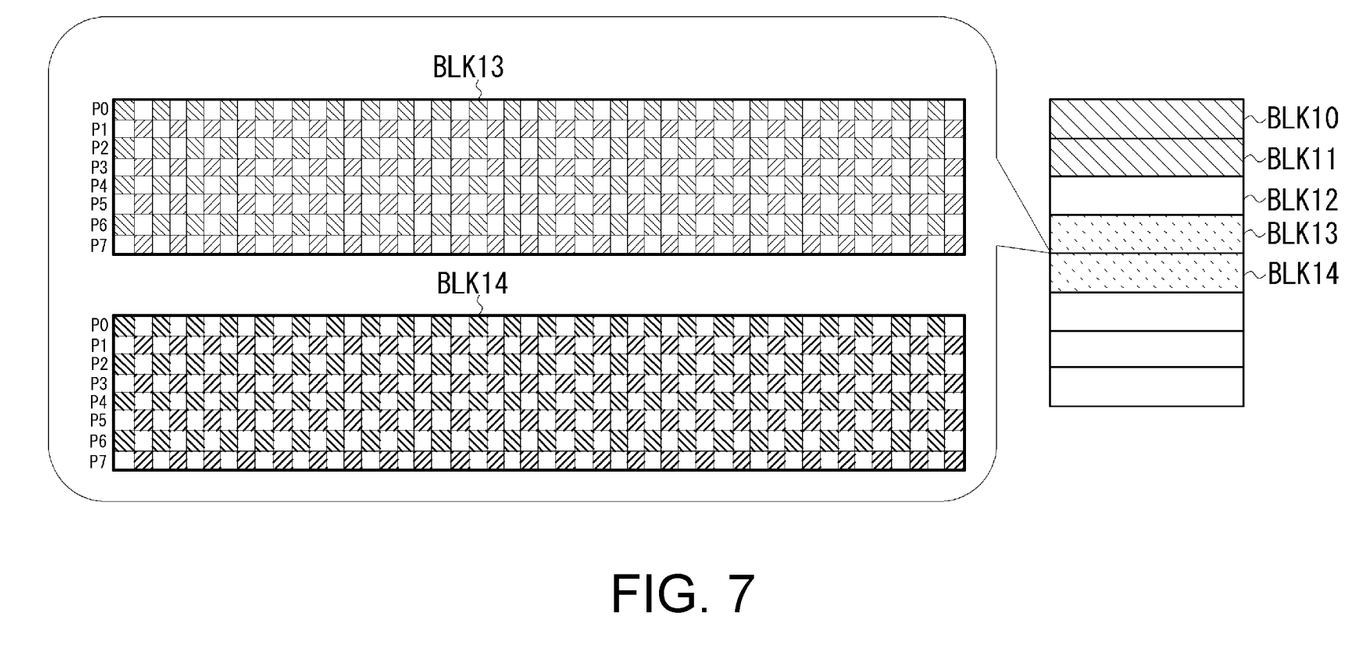
FIG. 7 is a diagram illustrating high-speed programming in a low-power/high-speed programming mode.

FIG. 7 shows an example of the high-speed programming. For the sake of illustration, it is assumed that one block includes 8 pages (P0 to P7). When a programming command, address, and data is input from the outside, a page of data to be programmed is set in the page buffer/sense circuit 160 in response to this. Then, even-numbered bits of the page buffer/sense circuit 160 are selected, data of the selected 1/2 page is programmed to the even-numbered page P0 of the block BLK13 at high speed, and then odd-numbered bits of the page buffer/sense circuit 160 are selected, data of the selected 1/2 page is programmed to the odd-numbered page P1 of the block BLK13 at high speed.

When a next programming command is input from the outside, the controller 140 programs the data of the even-numbered bits of 1/2 pages in the even-numbered page P2 of the block BLK13 at high speed, and then programs the data of the odd-numbered bits of 1/2 pages in the odd-numbered page P3 of the block BLK13 at high speed. After using all pages of the block BLK13 in the high-speed programming, the controller 140 then proceed with the high-speed programming on pages of the block BLK14.

FIG. 7 shows an example of high-speed programming on all pages P0 to P7 of the block BLK13 and the block BLK14. The data of the even-numbered bits and the odd-numbered bits are alternately programmed in the blocks BLK13 and BLK14, and a checkerboard pattern (including square pattern or checkered pattern) is programmed in the blocks. In the checkerboard pattern, memory cells adjacent to the programmed memory cells are not programmed, so coupling between memory cells may be reduced. In addition, the controller 140 maintains a relationship between the address input from the outside and page address of the block BLK13, which has been programmed at high speed. The relationship is used in the copy back described later.

In the high-speed programming of the checkerboard pattern, an example of sequential programming from the page with the new address is shown (sequence of P0 (even number), P1 (odd number), P2 (even number), P3 (odd number)), but this is only one example, and other sequences are possible. It is possible to program in the sequence of P0 (even number), P3 (odd number), P4 (even number), P7 (odd number) . . . , and then program in the sequence of P1 (odd number), P2 (even number), P5 (odd number), P6 (even number) . . .

Figure 8:
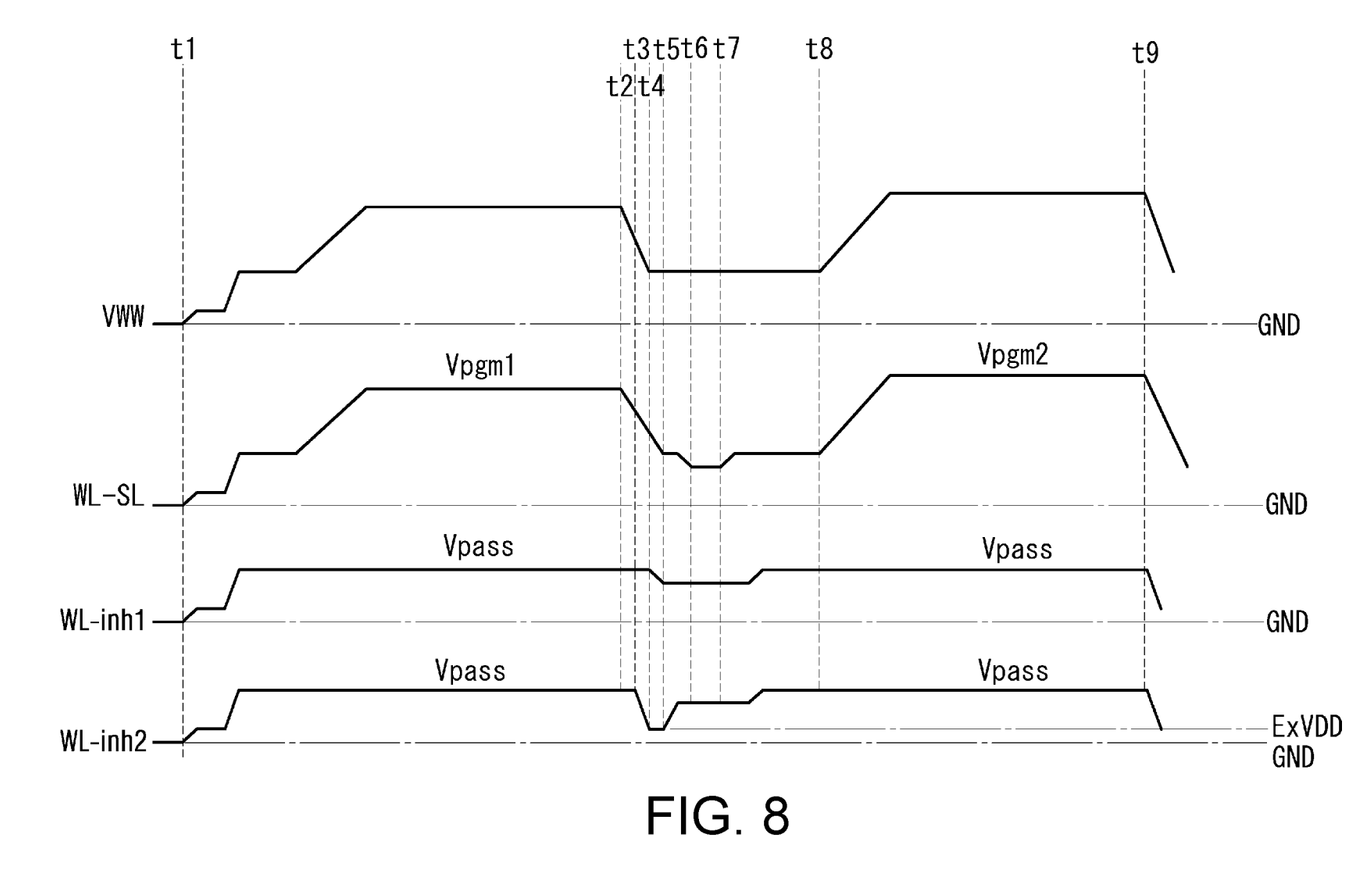
FIG. 8 is a diagram of voltage waveforms during a high-speed programming operation in a low-power/high-speed programming mode.

FIG. 8 is a diagram of voltage waveforms of various parts during a high-speed programming operation. VWW is a programming voltage generated by the internal voltage generation circuit 180, WL-SL is a selected word line, and WL-inh1 and WL-inh2 are non-selected word lines. For example, in the block BLK13 of FIG. 7, in the case of programming the even-numbered page P0, the selected word line WL-SL corresponds to page P0, and the non-selected word line WL-inh1 and the non-selected word line WL-inh2 correspond to page P1 to page P7. The non-selected word line WL-inh2 is one or more non-selected word lines electrically coupled to a discharge node having a certain positive potential before programming verification, and the remaining non-selected word line is the non-selected word line WL-inh1.

From time t1 to time t2, a programming voltage Vpgm1 generated by the internal voltage generation circuit 180 is applied to the selected word line WL-SL, and a programming pass-through voltage Vpass (e.g., 10 V) is applied to the non-selected word line WL-inh1 and the non-selected word line WL-inh2.

At time t2, the programming voltage Vpgm1 drops. At the same time, all word lines are separated from the internal voltage generating circuit 180 and become floating. That is, the programming voltage Vpgm1 is held on the selected word line WL-SL, and the pass-through voltage Vpass is held on the non-selected word line WL-inh1 and the non-selected word line WL-inh2.

From time t2 to time t3, the short circuit 156A shorts all word lines, i.e., the selected word line WL-SL and the non-selected word lines WL-inh1 and WL-inh2. As a result, the programming voltage Vpgm1 and the pass-through voltage Vpass are shared by all word lines. For example, if 18V is held as the programming voltage Vpgm1 for the selected word line WL-SL, and 10V is held as the pass-through voltage Vpass for the remaining 7 non-selected word lines WL-inh1 and WL-inh2, a voltage of approximately 11V ((70V+18V)/8) is held on each of the word lines when all word lines are shorted.

From time t4 to time t5, the discharge circuit 156B electrically connects the non-selected word line WL-inh2 to the discharge node having a certain positive potential, so that a portion of the charge held by all the word lines is discharged to the discharge node. The discharge node is a potential lower than a shorted common voltage, e.g., the external power supply voltage ExVDD (e.g., 3.3V). By properly selecting the discharge time (t4 to t5) to the discharge node and discharge resistance (a number of the non-selected word line WL-inh2), voltages of all word lines after discharge are adjusted to desired levels. For example, all word lines after discharge are adjusted to the same voltage as the readout pass-through voltage Vpass (4.5V) for verification read out.

From time t6 to time t7, a readout pass-through voltage generated by the internal voltage generation circuit 180 is applied to the non-selected word line WL-inh1 and the non-selected word line WL-inh2, and a readout voltage is applied to the selected word line WL-SL for programming verification. The discharged voltage is held on the non-selected word line WL-inh1 and the non-selected word line WL-inh2, thus reducing the voltage supply from the internal voltage generation circuit 180.

From time t8 to time t9, in order to program the memory cell that is verified as unqualified, a programming voltage Vpgm2 higher by one step voltage is applied to the selected word line WL-SL, and the programming pass-through voltage Vpass is applied to the non-selected word line WL-inh1 and the non-selected word line WL-inh2. The high-speed programming ends by applying two programming pulses.

The programming voltage Vpgm/pass-through voltage Vpass used during programming is used for programming verification before the programming verification is carried out, thus reducing the power consumption during verification.

Figure 9:
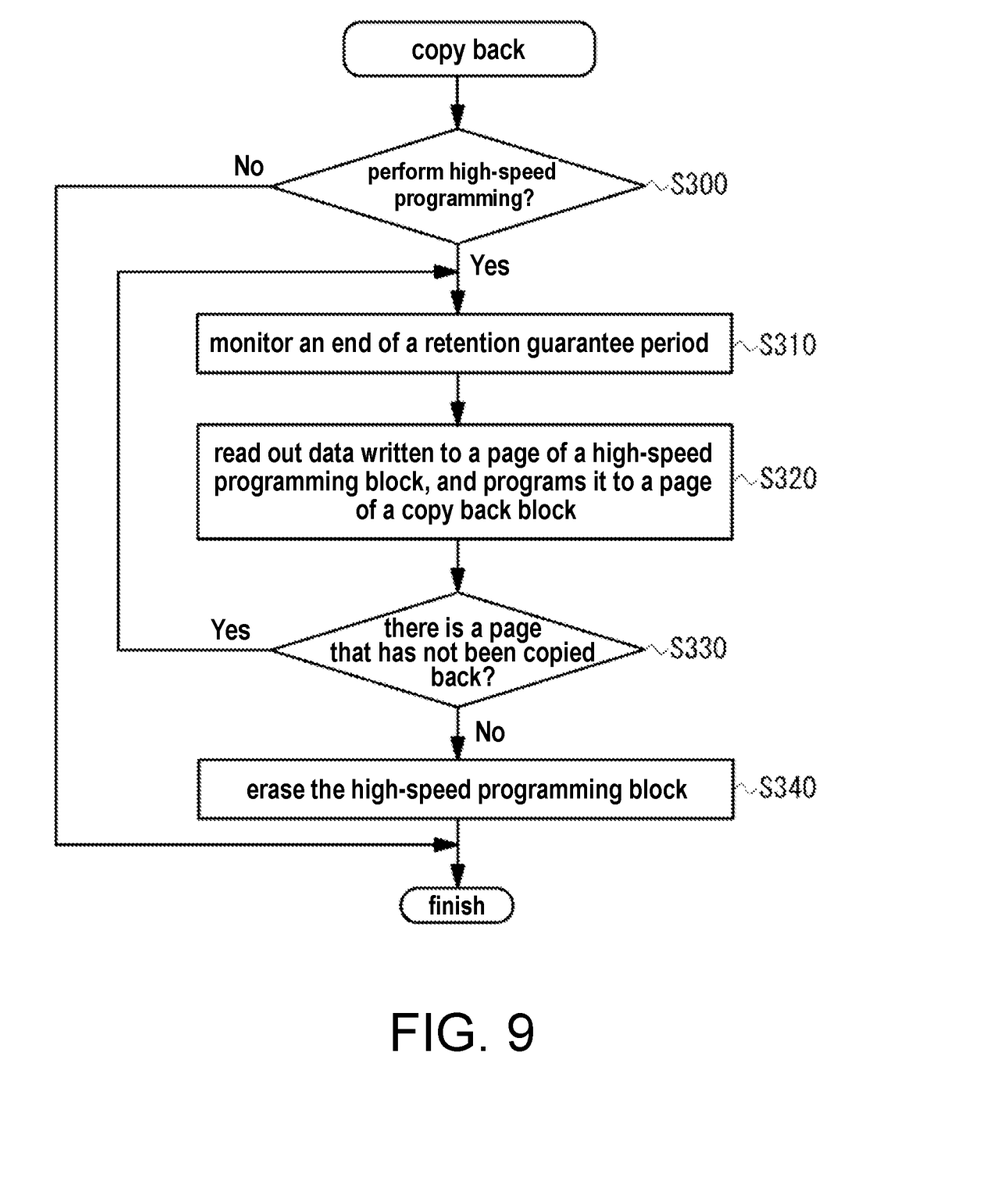
FIG. 9 is a diagram illustrating an operation of copy back in a low-power/high-speed programming mode.

Next, referring to the flowchart of FIG. 9, the details of the copy back (S30) of FIG. 3 is explained. In the case where the high-speed programming is implemented (S300), the controller 140 monitors an end of a retention guarantee period of the high-speed programmed memory cells (step S310). A method of monitoring the end of the retention guarantee period is not specifically limited; for example, the controller 140 may know the timing of the end of the retention guarantee period by means of a command or control signal from an external host computer. Alternatively, the controller 140 may itself know the end of the retention guarantee period from a timer that manages time, for example.

Before the end of the retention guarantee period, the controller 140 reads out the data written to a page of the high-speed programming block, and programs the read data to a page of the copy back block BLK12 (S320). The programming at this time is a normal page programming, and the programming voltage is higher than that of the high-speed programming, and the number of times the ISPP-based programming pulse is applied is not limited to two.

In a preferred embodiment, the controller 140 performs copy back during periods when power usage is not limited (e.g., during periods when relatively large amounts of power are supplied to the IoT device, during periods when power saving mode is deactivated, or during periods of idleness). The controller 140 may perform copy back in response to an external command or control signal, and the controller 140 may also manage the timing of copy back using a timer, etc.

Copy back may be implemented after all pages of the two high-speed programming blocks BLK13 and BLK14 have been used as shown in FIG. 7, or after some pages of the block BLK13 and the block BLK14 have been used.

Figure 10:
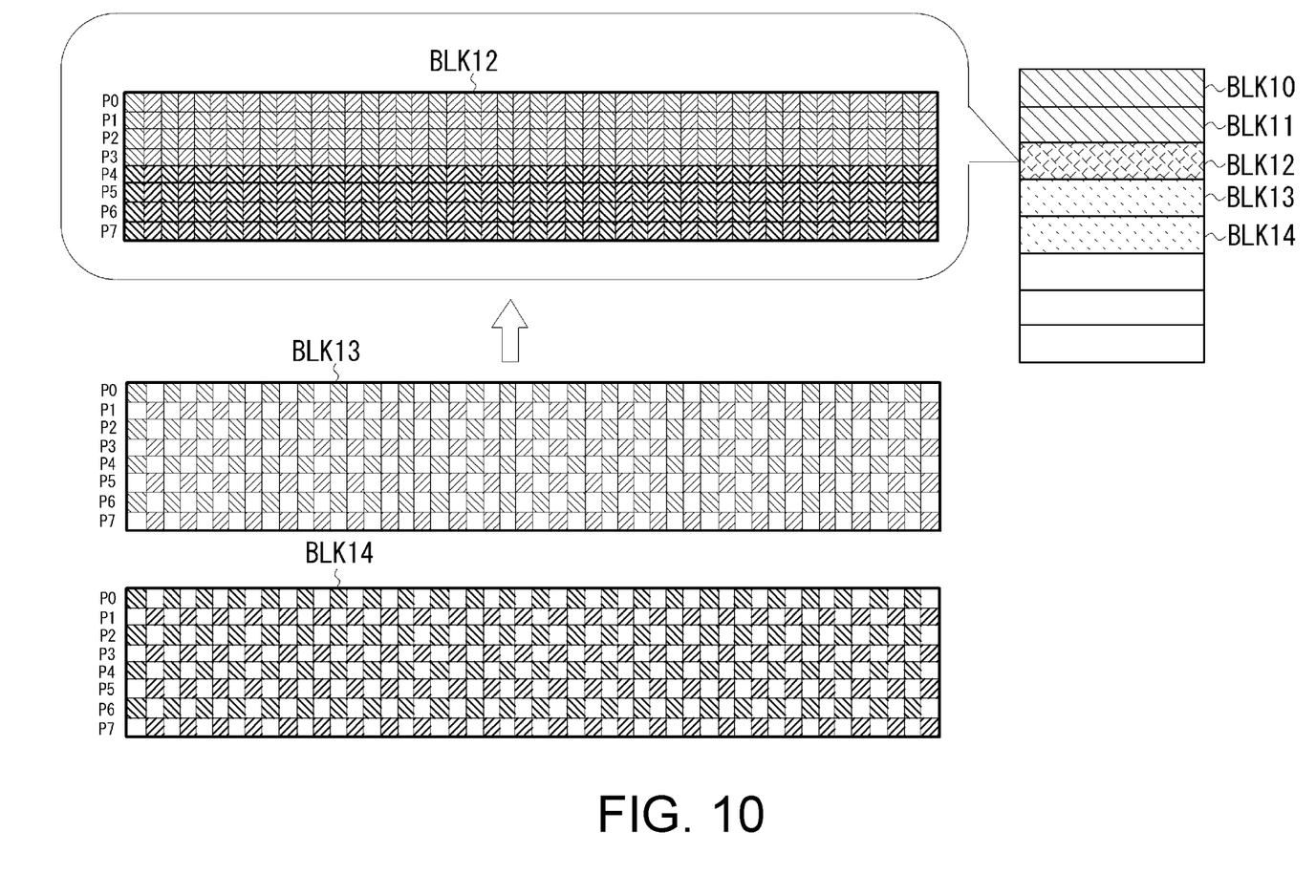
FIG. 10 is a diagram illustrating copy back in a low-power/high-speed programming mode.

FIG. 10 shows an example of copy back after all pages of the blocks BLK13 and BLK14 shown in FIG. 7 are programmed. Here, it is assumed that the high-speed programming is performed from page P0 to page P7 sequentially.

The controller 140 reads out the data of the even-numbered page P0 of the block BLK13, sets the read data to the even-numbered bits of the page buffer/sense circuit 160, then reads out the data of the odd-numbered page P1 of the block BLK13, sets the read data to the odd-numbered bits of the page buffer/sense circuit 160, and then programs the data set on one page of the page buffer/sense circuit 160 to the page P0 of the block BLK12.

The controller 140 identifies whether there is a page that has not been copied back in the high-speed programming block (S330), and if so, the controller 140 reads out the data on the even-numbered page P2 of the block BLK13, sets the read data to the even-numbered page of the page buffer/sense circuit 160, then read out the data on the odd-numbered page P3 of the block BLK13, sets the read data to the odd-numbered bit of the page buffer/sense circuit 160, and then programs the data set on one page of the page buffer/sense circuit 160 to the page P1 of the block BLK12. After that, the copy back is performed in the same way to page P7 of the block BLK14, and finally, the data of each page of the two blocks BLK13 and BLK14 is stored in the block BLK12. The controller 140 maintains the relationship between the address input from the outside and the address of the block BLK12.

Figure 11:
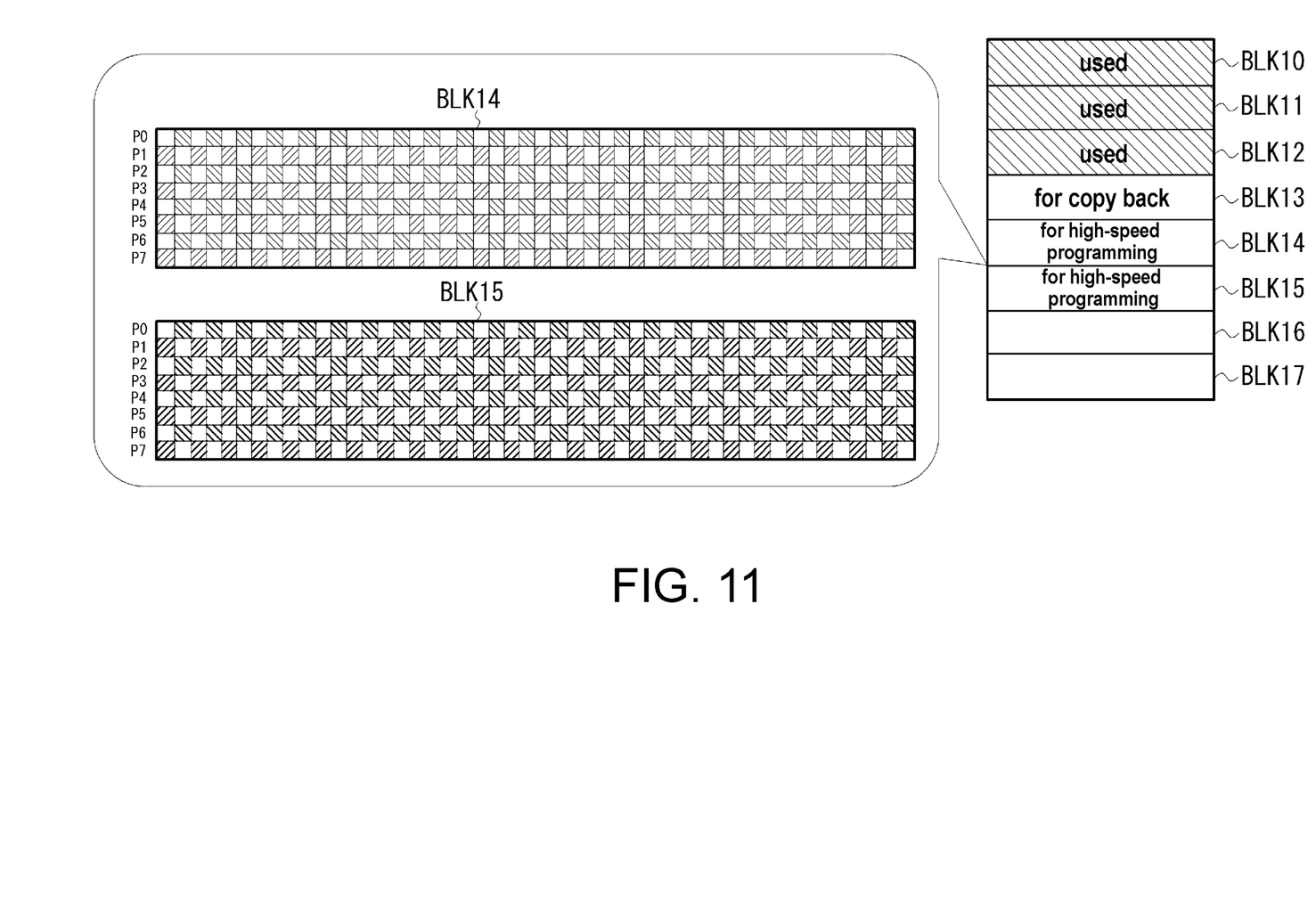
FIG. 11 is a diagram of an example of allocation of a new copy back block and high-speed programming block based on block management in a low-power/high-speed programming mode.

When the copy back is finished (S330), the controller 140 erases the high-speed programming block (S340) to prepare for the next high-speed programming. The block management S10 shown in FIG. 3 allocates the block BLK13 to the copy back block, and allocates the block BLK14 and the block BLK15 to the high-speed programming block when the copy back is finished, as shown in FIG. 11. In a preferred embodiment, when the high-speed programming is performed on the high-speed programming block BLK14, the controller 140 programs the data to the memory cell that was not used in the previous high-speed programming. That is, the high-speed programming is performed on odd-numbered bits of the even-numbered page P0, even-numbered numbered page P2, even-numbered page P4, and even-numbered page P6 of the block BLK14.

When the high-speed programming of the blocks BLK14 and BLK15 is finished, the copy back of the blocks BLK14 and BLK15 is performed, and the blocks BLK14 and BLK15 are erased. The block BLK14 is allocated to the next copy back block, and blocks BLK15 and BLK16 are allocated to the high-speed programming block. During high-speed programming of the block BLK15, even-numbered bits of the even-numbered page P0, even-numbered page P2, even-numbered page P4, and even-numbered page P6 and the odd-numbered bits of the odd-numbered page P1, odd-numbered page P3, odd-numbered page P5, and odd-numbered page P7 that were not used in the previous high-speed programming are selected as memory cells to be programmed.

This high-speed programming evens out the programming frequency or the stress caused by programming to the memory cells in the block, improves the reliability of the high-speed programming, and ensures sufficient read out margin for the memory cells.

According to this embodiment, the low-power/high-speed programming mode is set in the NAND flash memory to reduce the power consumption during programming operations, so that even if an electronic device such as an IoT is in a power-saving mode, a power-saving programming may be performed accordingly. In addition, during the period when relatively large power consumption is allowed, the data programmed with the low power/high-speed programming is copied back using the normal programming, so that programming may be performed according to the power condition of an electronic device such as an IoT.

According to the embodiment, an example of allocating blocks with consecutive block addresses to the copy back block and the high-speed programming block is shown, but this is only one example; the copy back block and the high-speed programming block do not necessarily need to have consecutive addresses, and blocks with arbitrary addresses may be allocated.

In addition, according to the embodiment, as shown in FIG. 7, the high-speed programming is performed on the even-numbered bits of the even-numbered page P0, even-numbed page P2, even-numbered page P4, and even-numbered page P6 of the block BLK13 and the block BLK14, and the high-speed programming is performed on the odd-numbered bits of odd-numbered page P1, odd-numbered page P3, odd-numbered page P5, and odd-numbered page P7, but not limited thereto. The high-speed programming may also be performed on the odd-numbered bits of the even-numbered page P0, even-numbered page P2, even-numbered page P4, and even-numbered page P6 of the block BLK13 and the block BLK14, and the high-speed programming is performed on the even-numbered bits of the odd-numbered page P1, odd-numbered page P3, odd-numbered page P5, odd-numbered page P7.

Furthermore, according to the embodiment, as shown in FIG. 7, it is shown that the high-speed programming is performed on the even-numbered pages and odd-numbered pages of the block BLK13, after all the pages of the block BLK13 are used, the high-speed programming is performed on the even-numbered pages and odd-numbered pages of the block BLK14, but not limited thereto. The high-speed programming may also be performed on 1/2 pages of data on the even-numbered pages or odd-numbered pages in the block BLK13, and the high-speed programming is performed on 1/2 pages of data on the odd-numbered pages or even-numbered pages in the block BLK14. In this case, the data is read out from the even-numbered pages or odd-numbered pages of the block BLK13 and the odd-numbered pages or even-numbered pages of the block BLK14, and the data of the read out page is programmed to the selected page of the copy back block.

Furthermore, according to the embodiment, an example of allocating two blocks to the high-speed programming block is shown, but not limited thereto, the high-speed programming block may be one or more than three. Data stored in one or more high-speed programming blocks is copied back to the copy back block during idle periods when power-saving mode is deactivated, or when relatively large amounts of power is supplied. In addition, according to the embodiment, an example of allocating one block to the copy back block is shown, but not limited thereto, multiple blocks may be allocated to the copy back block. In this case, the data read out from the high-speed programming block is programmed to the selected copy back block.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A programming method of a NAND flash memory, comprising:

allocating at least one block to a high-speed programming block, and allocating at least one block to a storage block for final data storage;

in response to an external input programming command, programming 1/2 pages of data at high-speed respectively on two selected pages of the high-speed programming block; and reading out data of the two selected pages of the high-speed programming block, and programming normally the read data into the storage block, wherein the high-speed programming has a lower voltage of a programming pulse and fewer application of programming pulses caused by verification failures than the normal programming.

2. The programming method according to claim 1, wherein the high-speed programming comprises shorting a selected word line holding a programming voltage and a non-selected word line holding a programming pass-through voltage during a programming verification, and after making the shorted word lines share a certain potential, applying a verification readout voltage to the selected word line and a readout pass-through voltage to the non-selected word line.

3. The programming method according to claim 2, wherein the high-speed programming further comprises discharging one or more word lines of the shorted word lines, and generating the certain potential by the discharge.

4. The programming method according to claim 1, wherein the high-speed programming is implemented during a period when power consumption is limited or during a power-saving mode, and the normal programming is implemented during a period when power consumption is not limited or when the power-saving mode is deactivated.

5. The programming method according to claim 1, wherein the high-speed programming programs 1/2 pages of data in even-numbered pages and odd-numbered pages of the high-speed programming block, respectively.

6. The programming method according to claim 1, wherein the high-speed programming programs the high-speed programming block as a checkerboard pattern.

7. The programming method according to claim 6, wherein the checkerboard pattern is generated by programming even-numbered or odd-numbered bits of even-numbered pages and odd-numbered or even-numbered bits of odd-numbered pages.

8. The programming method according to claim 5, wherein the high-speed programming comprises a loop for programming in an order of page P0, page P3, page P4, page P7 . . . of the high-speed programming block, and a loop for programming in an order of page P1, page P2, page P5, page P6 . . . .

9. The programming method according to claim 1, wherein the programming method comprises erasing the high-speed programming block, in the case of re-allocating the erased block to the high-speed programming block, the high-speed programming is performed in a memory cell different from a memory cell used in the previous high-speed programming.

10. A semiconductor device, comprising:

a NAND memory cell array; and a programming component programming on a selected page of the memory cell array, and the programming component comprising a normal programming mode and a high-speed programming mode, wherein the high-speed programming mode comprises:

allocating at least one block to a high-speed programming block, and allocating at least one block to a storage block for final data storage;

in response to an external input programming command, programming 1/2 pages of data at high-speed respectively on two selected pages of the high-speed programming block; and reading out data of the two selected pages of the high-speed programming block, and programming normally the read data into the storage block, wherein the high-speed programming mode has a lower voltage of a programming pulse and fewer application of programming pulses caused by verification failures than the normal programming mode.

11. The semiconductor device according to claim 10, wherein the high-speed programming mode comprises shorting a selected word line holding a programming voltage and a non-selected word line holding a programming pass-through voltage during a programming verification, and after making the shorted word lines share a certain potential, applying a verification readout voltage to the selected word line and a readout pass-through voltage to the non-selected word line.

12. The semiconductor device according to claim 11, wherein the high-speed programming mode further comprises discharging one or more word lines of the shorted word lines, and generating the certain potential by the discharge.

13. The semiconductor device according to claim 10, wherein the high-speed programming mode is implemented during a period when power consumption is limited or during a power-saving mode, and the normal programming is implemented during a period when power consumption is not limited or when the power-saving mode is deactivated.

* * * * *